(12) United States Patent
Hatagami

(10) Patent No.: US 7,511,507 B2
(45) Date of Patent: Mar. 31, 2009

(54) INTEGRATED CIRCUIT AND CIRCUIT BOARD

(75) Inventor: Toshifumi Hatagami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/247,647

(22) Filed: Oct. 11, 2005

(65) Prior Publication Data
US 2007/0013359 A1 Jan. 18, 2007

(30) Foreign Application Priority Data
Jul. 15, 2005 (JP) ............... 2005-206392

(51) Int. Cl.
*G01R 31/02* (2006.01)
(52) U.S. Cl. ............ 324/537; 324/73.1; 324/522; 324/765; 324/527; 324/719; 438/17; 438/18
(58) Field of Classification Search ........... 324/73.1, 324/522, 537, 765, 527, 719; 438/18, 17
See application file for complete search history.

(56) References Cited

U.S. PATENT DOCUMENTS

| | | | | |
|---|---|---|---|---|
| 4,857,833 | A * | 8/1989 | Gonzalez et al. | 324/512 |
| 5,072,175 | A * | 12/1991 | Marek | 324/73.1 |
| 6,731,106 | B2 * | 5/2004 | Whetsel | 324/158.1 |
| 7,215,132 | B2 * | 5/2007 | Yokota | 324/763 |
| 2004/0246008 | A1 * | 12/2004 | Barr et al. | 324/719 |
| 2005/0225754 | A1 * | 10/2005 | Ume et al. | 356/237.1 |

FOREIGN PATENT DOCUMENTS

| | | |
|---|---|---|
| JP | 11-64465 | 3/1999 |
| JP | 2000-206199 | 7/2000 |
| JP | 2003-329743 | 11/2003 |
| JP | 2005-191513 | * 6/2005 |

OTHER PUBLICATIONS

Johnson, Curtis D. Process Control Instrumentation Technology, John Wiley & Sons, 1982, p. 106-107.*

* cited by examiner

*Primary Examiner*—Timothy J. Dole
*Assistant Examiner*—Thomas F. Valone
(74) *Attorney, Agent, or Firm*—Greer, Burns & Crain, Ltd.

(57) ABSTRACT

An integrated circuit has an analog output circuit for outputting an analog signal and a leadless terminal for connecting an output line of the analog output circuit to a circuit board by soldering, and measures and transfers an analog output voltage of the leadless terminal in a state in which it is mounted on the circuit board. A measuring unit has a switching unit for connecting the analog output circuit to the measuring unit upon failure diagnosis, and an AD converter for measuring the analog output voltage of the leadless terminal in a failure diagnosis state obtained by the switching unit; and causes the analog output voltage of the leadless terminal to be determined whether it is a normal voltage or an abnormal voltage by transferring the voltage measured by the AD converter to a determination unit through serial transfer.

14 Claims, 16 Drawing Sheets

INTEGRATED CIRCUIT AND CIRCUIT BOARD

This application is a priority based on prior application No. JP 2005-206392, filed Jul. 15, 2005, in Japan.

BACKGROUND OF THE INVENTION

1. Field of the Invention

The present invention relates to an integrated circuit and a circuit board for connecting analog input/output lines to the circuit board side by solder connection of leadless terminals, and in particular, relates to an integrated circuit and a circuit board for self-diagnosing failure of signal lines including leadless terminals which externally connect analog input/output lines caused by manufacturing defects.

2. Description of the Related Arts

Conventionally, downsizing of parts and high density mounting are underway for electronic devices such as information processing devices, in order to realize requirements for downsizing the devices and for high-speed signal transmission. In order to realize such high-density mounting, elaborated structures are used for packages of integrated circuits. Conventionally, ball grid arrays (Ball Grid Array) and QFN packages (Quad Flat Non-Leaded Package) are known as leadless package structures which are suitable for high-density mounting of integrated circuits. A ball grid array, so-called BGA, is a package in which leadless terminals composed of solder balls are arranged in a grid with predetermined gaps therebetween on the bottom surface of the package which is in contact with a printed board, and the leadless terminals are soldered on the corresponding pattern of the printed board. Since the leadless terminals are on the bottom side of the package and in the narrow space sandwiched between the package and the printed board, solder paste for joining is applied in advance on the pattern of the printed board in a printing process, and the entire package is heated so as to perform soldering by melting the solder for joining which is in contact with the terminal part. Meanwhile, the QFN package is a package having a structure in which leads are removed and merely electrode pads for soldering are formed, wherein the electrode pads are positioned on the bottom surface of the package.

If failure of decreasing operating margins is present in a circuit device on which an integrated circuit using the ball grid array or QFN is used as a package structure, particularly, in an analog circuit part of a motor rotation speed control loop including a PLL, i.e., a charge pump circuit or the circuit part of a loop filter; a feedback loop is formed, therefore, the rotation control thereof can be generally performed. However, the rotation variation and rotation speed do not always satisfy specifications. In a method for narrowing down the failure location in such a case, the loop is opened so as to precisely measure and examine gains and linearity of operations of each block and operation points (offset); however, since normal operations cannot be performed when the loop is opened, specifying the location of the cause is extremely difficult, and requires advanced skills and many man-hours. When the location of failure is to be found out, it is required to see the state of the leadless terminals on the package bottom surface from which analog output signals are output to the circuit of the circuit board side; however, since the terminal part is hidden behind the package, it is difficult to detect short circuit failure, etc., which is due to abnormality in soldering part, poor connection, or adhesion of foreign conductive substance, by appearance examination by means of visual observation, therefore, obstacles for specifying the location of failure are caused. According to the present invention to provide an integrated circuit and a circuit board capable of readily diagnosing failure which is due to the terminal state of the integrated circuit having a package structure in which analog input/output lines are soldered on the circuit board side by leadless terminals which cannot be seen or difficult to be seen from outside in a mounted state.

SUMMARY OF THE INVENTION

The present invention provides an integrated circuit comprising a failure diagnosis function for a leadless terminal for analog output. The integrated circuit according to the present invention is characterized by comprising an analog output circuit for outputting an analog signal; a leadless terminal for connecting an output line of the analog output circuit to a circuit board by soldering; and a measuring unit for measuring an analog output voltage of the leadless terminal in a state in which it is mounted on the circuit board.

Herein, the measuring unit has a switching unit for obtaining a failure diagnosis state upon failure diagnosis by connecting the analog output circuit to the measuring unit, and an AD converter for measuring the analog output voltage of the leadless terminal in the failure diagnosis state obtained by the switching unit; and transfers the measured analog output voltage of the leadless terminal from the AD converter to an outside determination unit.

When a plurality of the analog output circuits are present, the switching unit sequentially connects the output lines of the analog output circuits which are targets of diagnosis to the AD converter upon failure diagnosis.

The switching unit comprises a first switching unit for connecting the output line of the analog output circuit which is a target of diagnosis to the AD converter upon failure diagnosis, and a second switching unit for connecting the output line of the analog output circuit which is the target of diagnosis to the leadless terminal.

The measuring unit receives an instruction from a processor which is incorporated in the integrated circuit or mounted on the circuit board so as to execute measurement of the analog output voltage of the leadless terminal and transfer the measurement result.

The present invention provides a determination program executed by a computer. The determination program of the present invention is characterized by causing a computer to execute a step of inputting an analog output voltage measured by a measuring unit of an integrated circuit comprising an analog output circuit for outputting an analog signal, a leadless terminal for connecting an output line of the analog output circuit to a circuit board by soldering, and the measuring unit for measuring the analog output voltage of the leadless terminal in a state in which it is mounted on the circuit board; and a step of determining the analog output voltage as a normal voltage if the voltage is in a predetermined voltage range centered on a stipulated voltage which is determined by output impedance of the analog output circuit and input impedance of an external analog input circuit of the circuit board which is connected via the leadless terminal, and determining the voltage as an abnormal voltage which is due to solder connection of the leadless terminal if the voltage falls out of the predetermined voltage range.

In another mode of the present invention, an integrated circuit comprising a failure diagnosis function for a leadless terminal for analog input is provided. More specifically, the integrated circuit of the present invention is characterized by comprising an analog input circuit for inputting an analog signal from outside; a leadless terminal for connecting an input line of the analog input circuit to an output line of an external analog output circuit provided on a circuit board by soldering; and a measuring unit for measuring and transferring an analog input voltage of the leadless terminal in a state in which it is mounted on the circuit board.

Herein, the measuring unit has a switching unit for obtaining a failure diagnosis state upon failure diagnosis by connecting the input line of the analog input circuit to the measuring unit, and an AD converter for measuring the analog input voltage of the leadless terminal in the failure diagnosis state obtained by the switching unit; and transfers the measured analog input voltage of the leadless terminal from the AD converter to an outside determination unit.

When a plurality of the analog input circuits are present, the switching unit sequentially connects the input lines of the analog input circuits which are targets of diagnosis to the AD converter upon failure diagnosis.

The switching unit comprises a first switching unit for connecting the input line of the analog input circuit which is a target of diagnosis to the AD converter upon failure diagnosis, and a second switching unit for connecting the input line of the analog input circuit which is the target of diagnosis to the leadless terminal.

The measuring unit receives an instruction from a processor which is incorporated in the integrated circuit or mounted on the circuit board so as to execute measurement of the analog input voltage of the leadless terminal and transfer the measurement result.

The present invention provides a determination program executed by a computer. The determination program of the present invention is characterized by causing a computer to execute a step of inputting an analog input voltage measured by a measuring unit of an integrated circuit comprising an analog input circuit for inputting an analog signal from outside, a leadless terminal for connecting an input line of the analog input circuit to an output line of an external analog output circuit provided on a circuit board by soldering, and the measuring unit for measuring the analog input voltage of the leadless terminal in a state in which it is mounted on the circuit board; and a step of determining the analog input voltage as a normal voltage if the voltage is in a predetermined voltage range centered on a stipulated voltage which is determined by output impedance of the external analog output circuit of the circuit board which is connected via the leadless terminal and input impedance of the analog input circuit, and determining the voltage as an abnormal voltage which is due to solder connection of the leadless terminal if the voltage falls out of the predetermined voltage range.

The present invention provides a circuit board on which an integrated circuit having analog output and an external circuit thereof are mounted. The integrated circuit is characterized by comprising an analog output circuit for outputting an analog signal; a leadless terminal for connecting an output line of the analog output circuit to the circuit board by soldering; and a measuring unit for measuring and transferring an analog output voltage of the leadless terminal in a state in which it is mounted on the circuit board.

It should be noted that the details of the integrated circuit mounted on the circuit board is basically same as that of the integrated circuit comprising the function of diagnosing failure of the leadless terminal for analog output.

The present invention provides a circuit board on which an integrated circuit in which an analog input circuit for receiving an analog signal is provided and an external circuit thereof are mounted. The integrated circuit is characterized by comprising an analog input circuit for inputting an analog signal from outside; a leadless terminal for connecting an input line of the analog input circuit to an output line of an external analog output circuit provided on the circuit board by soldering; and a measuring unit for measuring and transferring an analog input voltage of the leadless terminal in a state in which it is mounted on the circuit board. It should be noted that the details of the integrated circuit mounted on the circuit board are basically same as that of the integrated circuit comprising the function of diagnosing failure of the leadless terminal for analog input.

According to the present invention, even though the soldering part between the pattern of the circuit board and the leadless terminal for analog output or the leadless terminal for analog input cannot be seen in the state in which the integrated circuit is mounted on the circuit board, when the processor on the circuit board instructs the integrated circuit about failure diagnosis, the analog output voltage or the analog input voltage of the leadless terminal is read by the AD converter with high accuracy, and it is determined to be normal or abnormal by comparing it with a stipulated voltage which is determined by the impedance of the analog output circuit and the analog input circuit connected to the signal line including the leadless terminal, thereby readily diagnosing the soldering state of the signal line including the leadless terminal for analog output or input which is difficult to be examined by appearance examination. The abnormality which can be detected by this failure diagnosis includes increase in leakage current and short circuit failure caused by adhesion of a foreign conductive substance or the like between the leadless terminal of the integrated circuit and a ground pattern, a power supply pattern, or another low impedance signal line of the circuit board. Therefore, when failure occurs in an instrument or a device incorporating the circuit board on which the integrated circuit which performs analog input/output and comprises the measuring unit according to the present invention is mounted, by executing the failure diagnosis of the present invention with respect to the integrated circuit, presence of abnormality of the analog output signal or analog input signal caused by the soldering state of the leadless terminal that cannot be seen from outside can be readily detected. In addition, since inspection processes of products include the failure diagnosis of the integrated circuit comprising the analog output circuit or analog input circuit according to the present invention, failure can be found in a step before product shipping, and the production yield of a post-process can be improved, thereby improving the reliability of the products. The above and other objects, features, and advantages of the present invention will become more apparent from the following detailed description with reference to the drawings.

DETAILED DESCRIPTION OF THE PREFERRED EMBODIMENTS

Figure 1A:
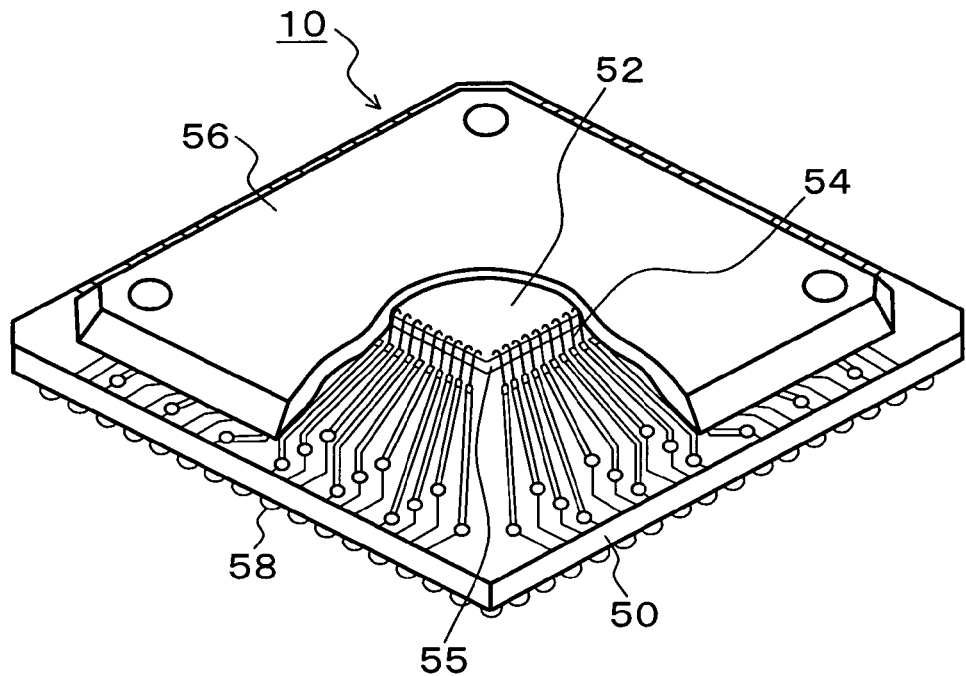
FIGS. 1A and 1B are explanatory drawings of an integrated circuit which is using a ball grid array package and serving as a target of the present invention.
Figure 1B:
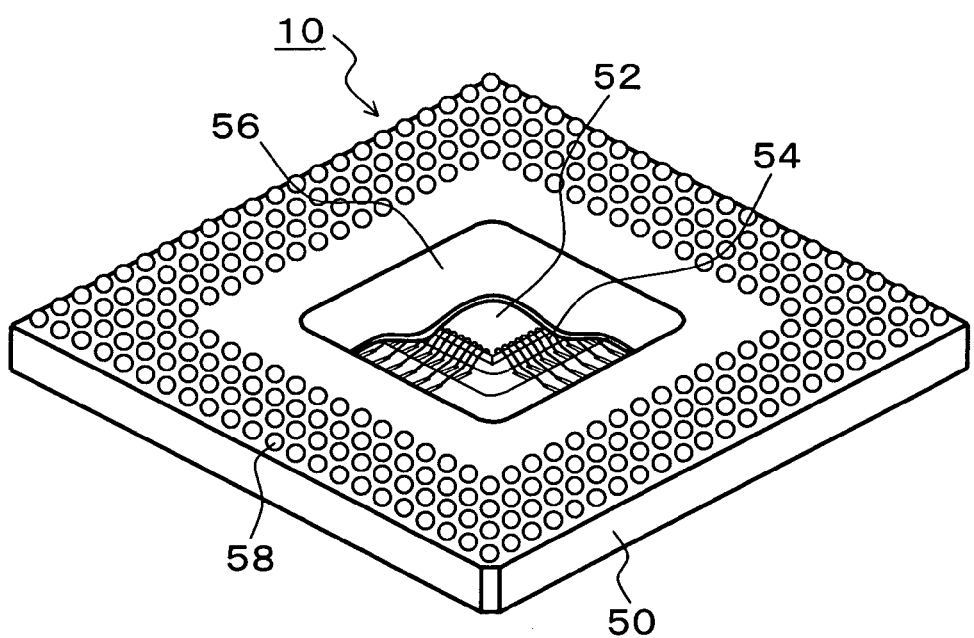

FIGS. 1A and 1B are explanatory drawing of the package structure of an integrated circuit which is using a ball grid array and serving as a target of the present invention. FIG. 1A is a perspective view of the upper side of an integrated circuit 10 which is serving as a target of the present invention, wherein a chip 52 is disposed on a multilayer printed board 50 via a stage 55, the terminal side of the multilayer printed board 50 and the chip 52 are connected to each other by Au wires 54, and the upper part thereof is sealed by resin 56. On the bottom surface of the multilayer printed board 50, as shown in the explanatory drawing of FIG. 1B of the bottom side, solder balls 58 are arranged in a grid. The integrated circuit 10 having such a structure and serving as a target of the present invention is positioned and disposed in a state in which solder paste for joining is applied in a printing process on the pattern of the circuit board, and the entire package is heated, thereby causing the solder balls 58 to melt so as to perform soldering. Therefore, in a state in which the integrated circuit 10 is mounted on the circuit board by soldering, the soldered state with the pattern using the solder balls 58 of the bottom surface side cannot be seen from outside.

Figure 2:
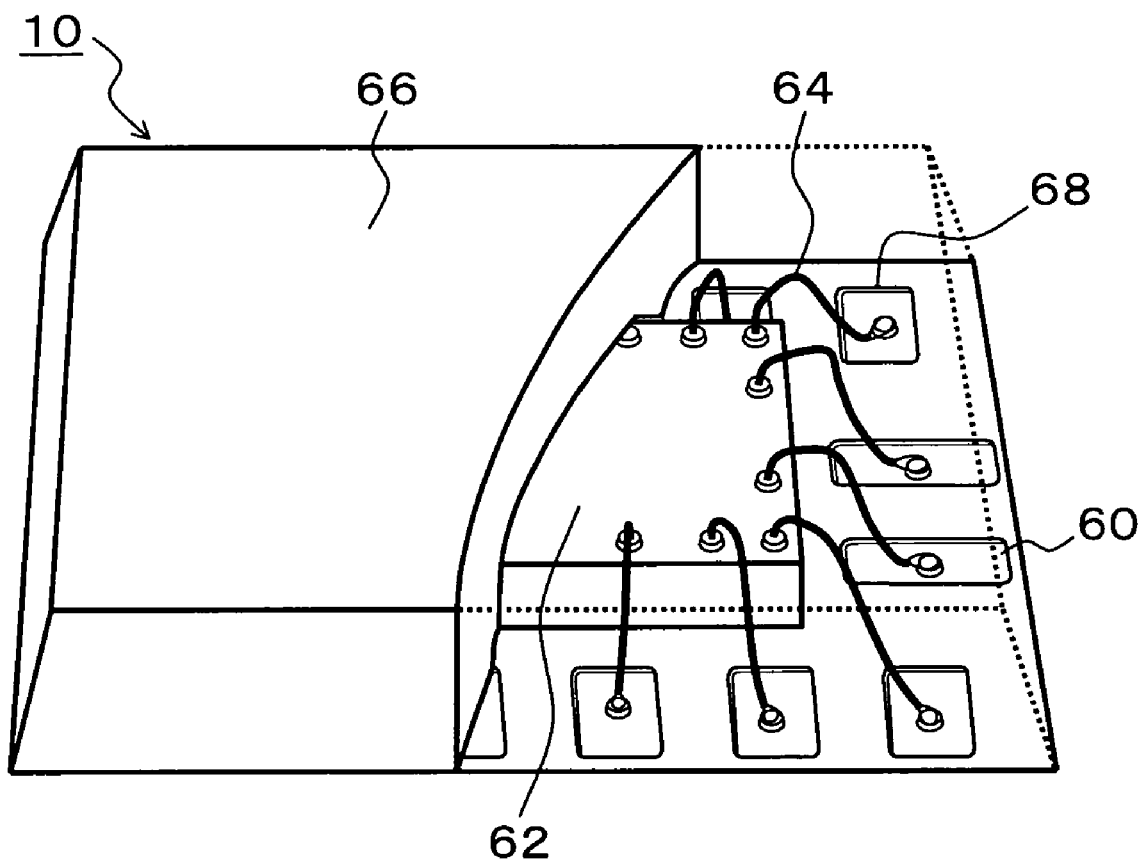
FIG. 2 is an explanatory drawing of an integrated circuit which is using a QFN package and serving as a target of the present invention.

FIG. 2 is an explanatory drawing of an integrated circuit 10 which is serving as a target of the present invention and using a QFN package. In FIG. 2, terminals 60 having no leads and Au bumps 68 are disposed on the bottom surface of the package, they are connected to a chip 62 by Au wires 64, and the upper part thereof is sealed by resin 66. The integrated circuit 10 having such a structure is positioned and disposed in a state in which solder paste for joining is applied in a printing process on the pattern of the circuit board, and the entire package is heated, thereby performing soldering; and, in the mounted state, the soldered state of the terminals 60 on the bottom surface side cannot be seen from outside.

Figure 3:
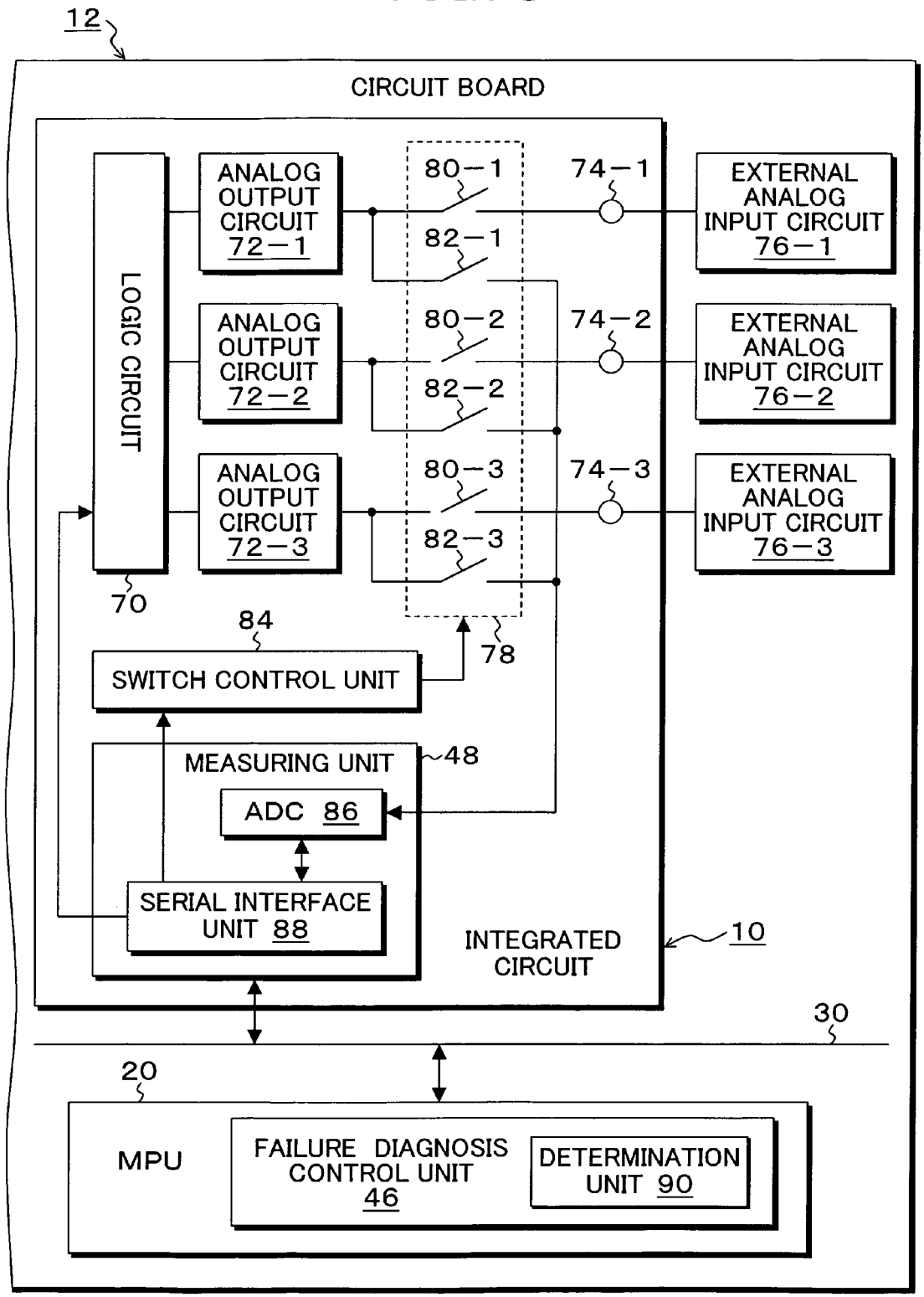
FIG. 3 is a block diagram of an integrated circuit according to the present invention for self-diagnosing failure of signal lines including leadless terminals for analog output.

FIG. 3 is a circuit block diagram of an integrated circuit according to the present invention for self-diagnosing failure of signal lines including leadless terminals for analog output. In FIG. 3, in an integrated circuit 10 which is using a package of a ball grid array or a QFN package, a measuring unit 48 for diagnosing the leadless terminals which are connected to the pattern of a circuit board 12 by soldering is provided. The measuring unit 48 measures and transfers the analog output voltages of the leadless terminals which are fixed by soldering in a state in which the integrated circuit 10 is mounted on the circuit board 12. A failure diagnosis control unit 46 having a determination unit 90 is provided in a MPU 20 which functions as a processor correspondingly to the measuring unit 48 of the integrated circuit 10. Regarding a diagnosis process by the measuring unit 48 of the integrated circuit 10, a failure diagnosis process is performed at the same time when assembling in the manufacturing line of the device using the circuit board 12 on which the integrated circuit 10 of the present invention is mounted is completed, at which point, the device is connected to test equipment and a test process is performed. The test equipment downloads a program for testing to, for example, a memory of the MPU 20, which is on the circuit board 12, in a state in which the device is connected, and the MPU 20 executes the program for testing which has been downloaded to the memory, thereby performing a required test process. The program for testing downloaded from the test equipment includes a failure diagnosis program of the leadless terminals for analog output, and, when the failure diagnosis program is executed, the function of the failure diagnosis control unit 46 of the MPU 20 is realized. More specifically, the MPU 20 realizes the function of the failure diagnosis control unit 46 by executing the failure diagnosis program which has been downloaded from the test equipment, gives an instruction via a serial bus 30 to the measuring unit 48, which is provided in the integrated circuit 10, to perform measurement for diagnosing the state of the analog output voltage which depends on soldering of the leadless terminal, at the same time, sets a logic circuit 70 to be in an operation state for outputting target analog voltage signals required for measurement of analog output circuits 72-1 to 72-3, obtains the diagnosis result by subjecting the measured voltage data which has been transferred from the measuring unit 48 to determination at the determination unit 90, and notifies the test equipment of it. The integrated circuit 10 has an arbitrary logic circuit 70, and the analog output circuits 72-1 to 72-3 are provided subsequently to the logic circuit 70. The output of the analog output circuits 72-1 to 72-3 is input and connected to external analog input circuits 76-1 to 76-3, which are disposed on the circuit board 12 on which the integrated circuit 10 is mounted, via leadless terminals 74-1 to 74-3. The measuring unit 48 according to the present invention comprises a switching unit 78, a switch control unit 84, an AD converter 86, and a serial interface unit 88. In the switching unit 78 provided are first selector switches 80-1 to 80-3 serving as first switching units for connecting output lines of the analog output circuits 72-1 to 72-3 to the leadless terminals 74-1 to 74-3 and second selector switches 82-1 to 82-3 serving as second switching units for selectively inputting and connecting the output lines of the analog output circuits 72-1 to 72-3 to the AD converter 86. The switching unit 78 operates when an instruction command of failure diagnosis is received from the failure diagnosis control unit 46 of the MPU 20 via the serial interface unit 88, and sequentially switches the switches of the switching unit 78, for example, along the order of the analog output circuits 72-1 to 72-3. More specifically, first, the first selector switch 80-1 and the second selector switch 82-1 corresponding to the analog output circuit 72-1 are turned on; in a state in which the output line of the analog output circuit 72-1 is connected to an input line of the external analog input circuit 76-1 via the leadless terminal 74-1, the voltage of the analog input/output line that is from the output of the analog output circuit 72-1 to the input of the analog input circuit 76-1 via the leadless terminal 74-1 is input to the AD converter 86 via the second selector switch 82-1; and the analog output voltage applied to the leadless terminal 74-1 is converted into digital data and output from the serial interface unit 88 to the MPU 20 via the serial bus 30. When measurement of the analog output voltage of the leadless terminal 74-1 corresponding to the analog output circuit 72-1 is finished, the first selector switch 80-1 and the second selector switch 82-1 are switched to be off, and the first selector switch 80-2 and the second selector switch 82-2 are then switched to be on, thereby performing measurement of the analog output voltage of the leadless terminal 74-2 which is corresponding to the analog output circuit 72-2. This is repeated in the same manner also for the analog output circuit 72-3. The function of the determination unit 90 is provided in the failure diagnosis unit 46 of the MPU 20. For example when the failure diagnosis method with respect to the leadless terminal 74-1 of the analog output circuit 72-1 is taken as an example, the determination unit 90 sets in advance the voltage of the leadless terminal 74-1 that is determined by the output impedance of the analog output circuit 72-1 and the input impedance of the external analog input circuit 76-1 as a stipulated voltage, in a state in which the first selector switch 80-1 and the second selector switch 82-1 are turned on; determines the range that is centered on and $\pm \Delta V$ the stipulated voltage and permissible as the analog output voltage as a normal voltage range based on the digital data measured by the AD converter 86; and determines that the voltage ranges other than that are in abnormal voltage ranges. In a state in which it is connected to the circuit pattern of the circuit board 12 by soldering, the analog output voltage of the signal line of the leadless terminal 74-1 is at the stipulated voltage that is determined by the input/output impedance viewed from the leadless terminal 74-1 if no foreign conductive substance is present between the leadless terminal 74-1 and a plus pattern or a ground pattern that is on the circuit board; however, if a foreign conductive substance has adhered between the leadless terminal 74-1 and the pattern of the circuit board 12 side during a manufacturing process such as soldering, the input/output impedance viewed from the leadless terminal 74-1 changes due to the resistance component of the foreign conductive substance, and, as a result, the analog output voltage measured by the AD converter 86 falls out of the normal voltage range. When determination based on the measurement results of the analog output voltages with respect to all of the leadless terminals 74-1 to 74-3 using the switching unit 78 is finished, the determination unit 90 considers the information of the leadless terminal that has been determined to be in an abnormal voltage range among the determination results as a failure diagnosis result, and sends the failure diagnosis result from the MPU 20 to the outside test equipment.

Figure 4:
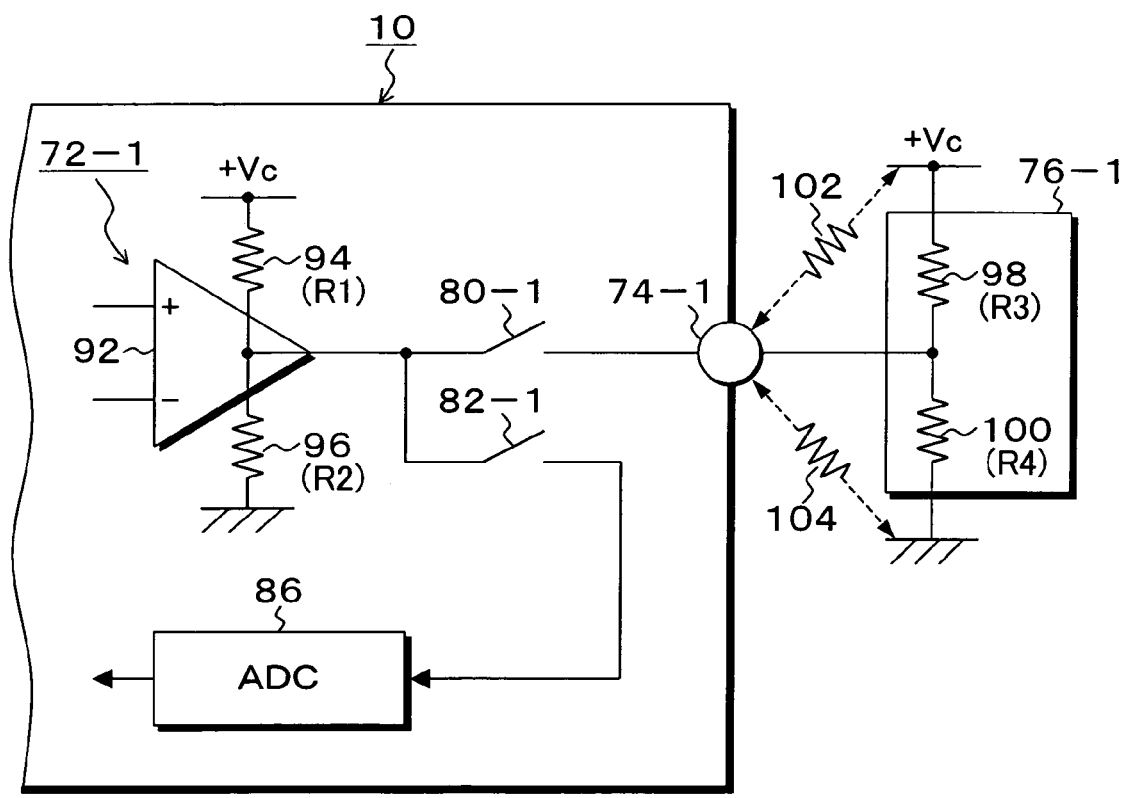
FIG. 4 is an explanatory drawing of the diagnosis fundamentals with respect to a leadless terminal for analog output in FIG. 3.

In FIG. 4, the diagnosis fundamentals for the leadless terminals for analog output in FIG. 3 are abstracted and shown about the analog output circuit 72-1. In FIG. 4, the analog output circuit 72-1 can be represented by an operational amplifier 92 and output resistance 94 and 96 connected in series between a power supply line and ground. The output of the analog output circuit 72-1 is connected to the leadless terminal 74-1 via the first selector switch 80-1, and, from there, it is input and connected to the external analog input circuit 76-1 through the pattern on the circuit board 12 which is connected by soldering. The external analog input circuit 76-1 can be treated as a circuit in which input resistance 98 and 100 is connected in series with respect to the input line between a power supply line and ground. Furthermore, the output of the analog output circuit 72-1 is input and connected to the AD converter 86, which is serving as a measuring unit, via the second selector switch 82-1. In such analog input/output circuits for the leadless terminal 74-1, when the leadless terminal 74-1 is connected to the pattern of the circuit board 12 by soldering, sometimes a foreign conductive substance such as flux or dust adheres. The foreign conductive substance 102, 104 adhered between the leadless terminal 74-1 and the pattern on the circuit board can be considered as a kind of a resistance component. Therefore, when the foreign conductive substance 102, 104 adhered, the input/output impedance viewed from the leadless terminal 74-1 has a value that is different from a normal case due to the resistance component of the foreign conductive substance 102, 104.

Figure 5A:
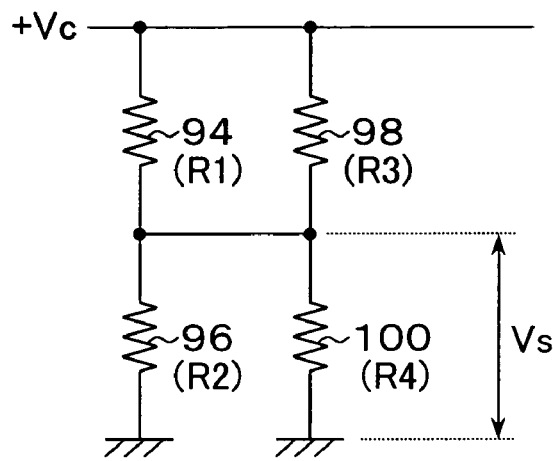
FIGS. 5A to 5C are equivalent circuit diagrams of the input/output impedance of the cases when the leadless terminal of FIG. 4 is normal and when a foreign conductive substance adheres to power supply Vc or ground 0V.
Figure 5B:
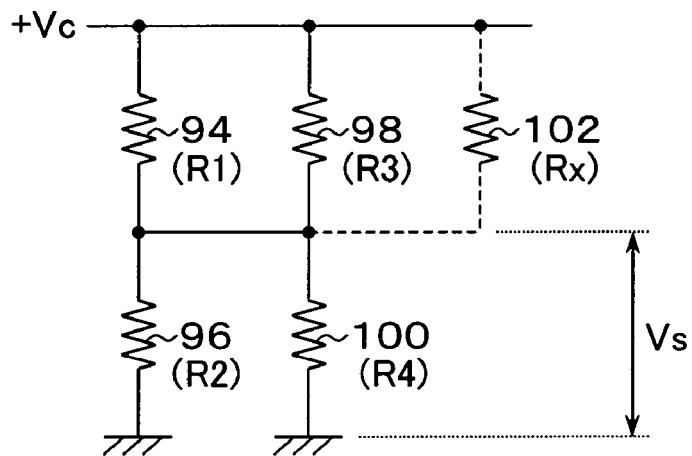
Figure 5C:
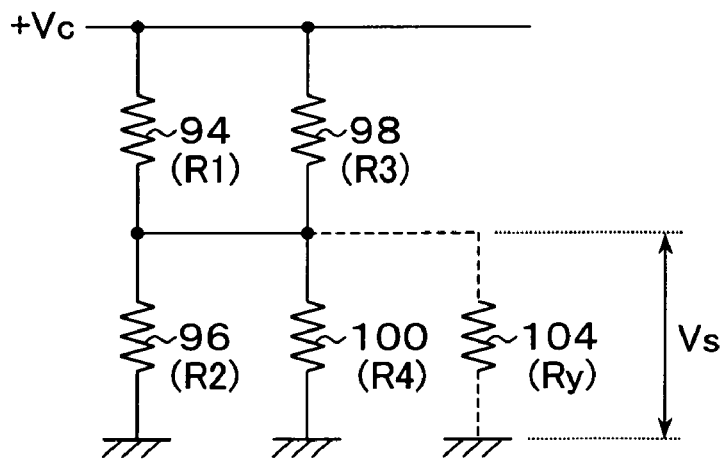

FIGS. 5A to 5C show equivalent circuit diagrams of the input/output impedance of the cases when the leadless terminal of FIG. 4 is normal and when a foreign conductive substance has adhered to power supply Vc or ground 0V.

FIG. 5A shows the case in which the leadless terminal is normal; in this case, it is a ladder type circuit in which the voltage dividing points of a series circuit of the output resistance 94 and 96 of the analog output circuit 72-1 and a series circuit of the input resistance 98 and 100 of the external analog input circuit 76-1 are connected; and the analog output voltage Vs of the leadless terminal can be obtained by the following expression.

$$V_S = \frac{(R2 // R4)}{(R1 // R3) + (R2 // R4)} V_C \qquad \text{Expression 1}$$

It should be noted that, for example, (R1//R3) is abbreviating the parallel resistance value of resistance R1 and R3 so as to represent it, and, to be precise, it can be obtained by (R1//R3)=1/{(1/R1)+(1/R3)}. Herein, when the resistance value of the output resistance 94 is R1, the resistance value of the output resistance 96 is R2, the resistance value of the input resistance 98 is R3, and the resistance value of the input resistance 100 is R4, wherein R1=R2 and R3=R4; in the normal case when no foreign conductive substance is adhering to the leadless terminal, the analog output voltage Vs is: Vs=Vc/2. The resistance values of the resistance R1, R2, R3, and R4 of this case are, for example, R1=R2=300 KΩ and R3=R4=1 MΩ. Therefore, the parallel resistance value is (R1//R3)=(R2//R4)=about 230 KΩ.

FIG. 5B shows an equivalent circuit of the case in which the foreign conductive substance 102 has adhered between the leadless terminal 74-1 and the plus line on the circuit board 12 in FIG. 4, wherein the resistance component of the foreign conductive substance 102 is Rx. The analog output voltage Vs of the leadless terminal of this case can be obtained by the following expression.

$$V_S = \frac{(R2 // R4)}{(R1 // R3 // Rx) + (R2 // R4)} V_C \qquad \text{Expression 2}$$

In this case, since the resistance component of the foreign conductive substance 102 is added, the analog output voltage Vs of the leadless terminal changes to a voltage that is higher than that in the normal case of FIG. 5A.

FIG. 5C is an equivalent circuit diagram of the case in which, as shown in FIG. 4, the foreign conductive substance 104 has adhered between the leadless terminal 74-1 and a ground line on the circuit board 12. Herein, the resistance component of the foreign conductive substance 104 is Ry. The analog output voltage Vs of the leadless terminal of this case can be obtained by the following expression.

$$Vs = \frac{(R2 \ // \ R4 \ // \ Ry)}{(R1 \ // \ R3) + (R2 \ // \ R4 \ // \ Ry)} Vc \qquad \text{Expression 3}$$

When the resistance component Ry caused by adhesion of the foreign conductive substance 104 is added, the analog output voltage Vs of the leadless terminal changes to a voltage that is lower than that in the normal case of FIG. 5A.

Figure 6:
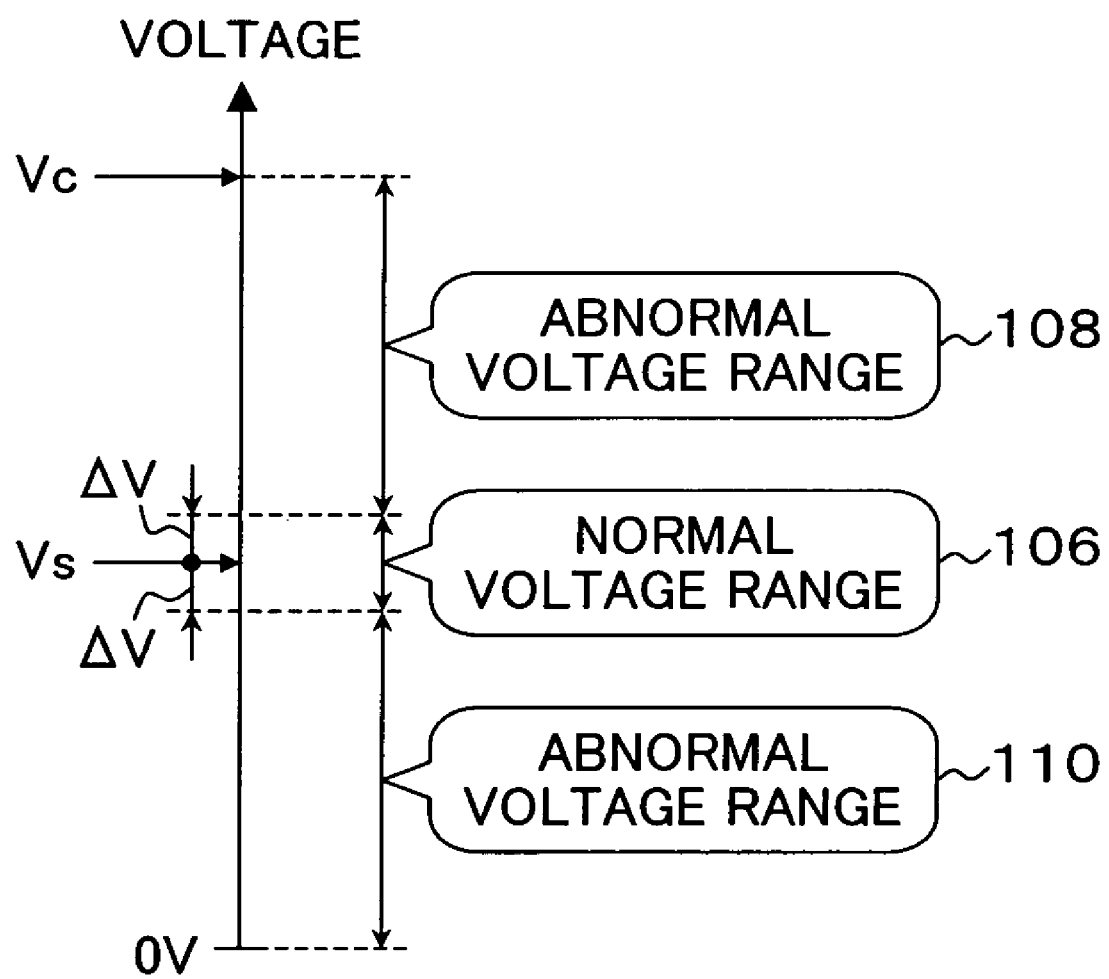
FIG. 6 is an explanatory drawing of the normal voltage range and abnormal voltage ranges of the analog output voltage subjected to determination by the determination unit of FIG. 3.

FIG. 6 is an explanatory drawing of the normal voltage range and abnormal voltage ranges of the analog output voltage which is subjected to determination by the determination unit 90 of FIG. 3. In FIG. 6, the analog output voltage Vs of the case of FIG. 5A when the leadless terminal is normal is, for example, Vc/2. A permissible range of variation of the analog output voltage that is ±ΔV with respect to the stipulated voltage Vs of the normal case is set, and this is determined as a normal voltage range 106. With respect to such normal voltage range 106, the voltage range above that is determined as an abnormal voltage range 108, and the voltage range below that is determined as an abnormal voltage range 110. The normal voltage range 106 and the abnormal voltage ranges 108 and 110 are set in advance in the determination unit 90 of FIG. 3; by comparing them with the analog output voltage which has been measured by the AD converter 86 by switching the switches in the switching unit 78 for failure diagnosis, whether or not it is in any of the abnormal voltage ranges or the normal voltage range is determined; and, if it is in any of the abnormal voltage ranges, the measured voltage is saved in a failure diagnosis file, and an abnormal flag is turned on. It should be noted that, in the embodiment of FIG. 3, the function of determining whether the analog output voltage measured by the AD converted 86 is in the normal voltage range or any of the abnormal voltage ranges is provided in the determination unit 90 which is provided in the MPU 20; however, the determination function may be provided in the side of the measuring unit 48 of the integrated circuit 10. Moreover, in the embodiment of FIG. 3, the reason why, the switching unit 78 has, in addition to the second selector switches 82-1 to 82-3 for sequentially measuring the analog output voltages of the leadless terminals 74-1 to 74-3, the first selector switches 80-1 to 80-3 for sequentially connecting the output of the analog output circuits 72-1 to 72-3 to the leadless terminals 74-1 to 74-3 upon failure diagnosis is in order to avoid influence on the analog input/output line which is the target of failure diagnosis and to improve resolving power by completely separating the connection state with respect to the leadless terminals of other analog output circuit units upon failure diagnosis of a particular analog input/output circuit unit. In addition, by providing the first selector switches 80-1 to 80-3, in addition to measurement of the analog output voltages of the leadless terminals 74-1 to 74-3, the analog output voltages per se of the analog output circuits 72-1 to 72-3 can be directly measured by sequentially turning on the second selector switches 82-1 to 82-3 in a state in which the first selector switches 80-1 to 80-3 are off, thus the resolving power of determination can be further improved.

Figure 7:
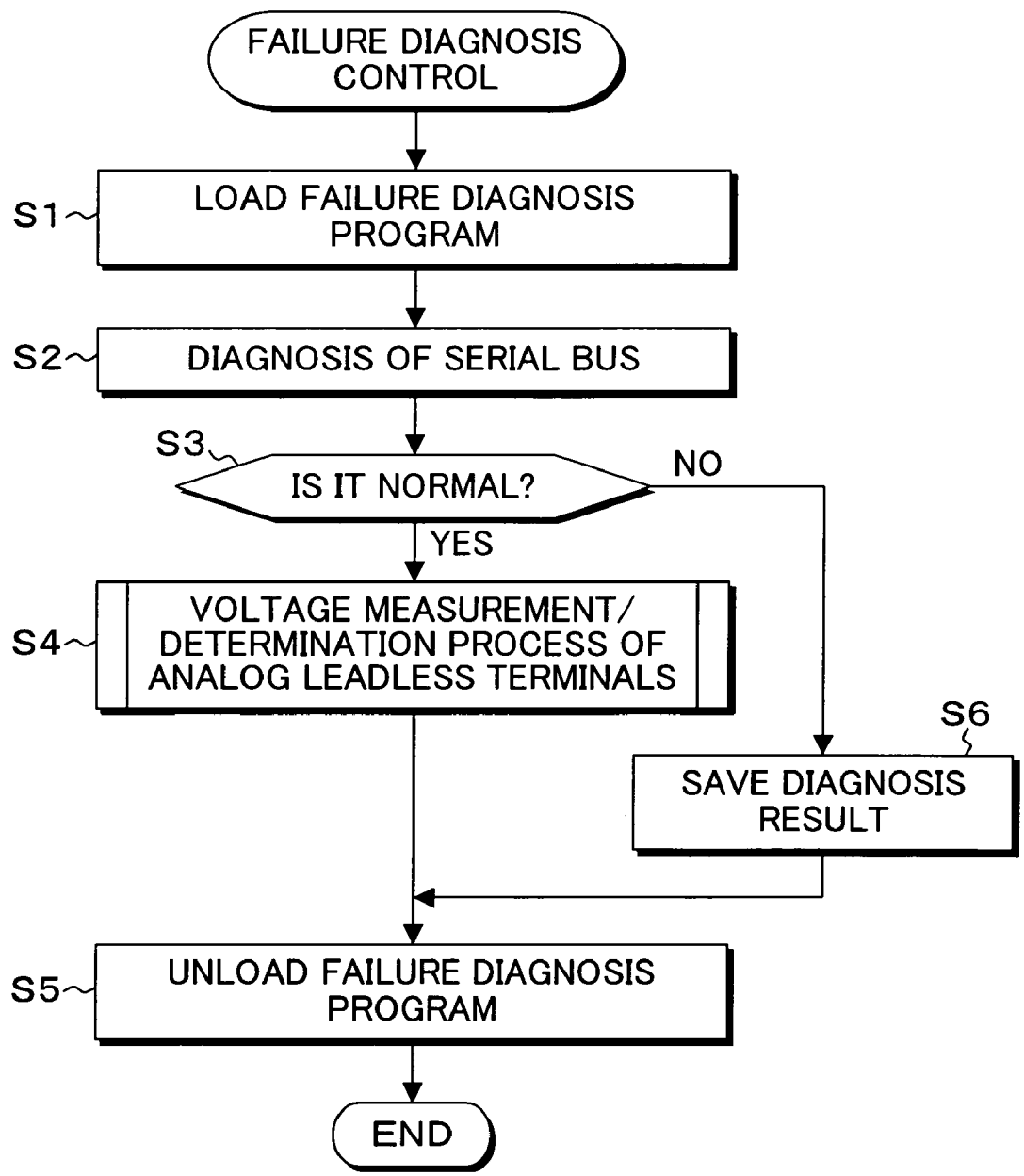
FIG. 7 is a flow chart of failure diagnosis by the MPU of FIG. 3.

FIG. 7 is a flow chart of failure diagnosis control by the failure diagnosis control unit 46 which is provided in the MPU 20 of FIG. 3. In FIG. 7, first, the failure diagnosis program is loaded from the external test equipment in step S1, and diagnosis of the serial bus 30, which performs serial transfer between the MPU 20 and the measuring unit 48 of the integrated circuit 10, is executed in step S2. In this diagnosis, for example, whether the same data can be read from the MPU 20 after the data is transferred and written to an arbitrary register used in the measuring unit 48 side is diagnosed, by causing it to perform read response. When the diagnosis result of the serial bus 30 is determined to be normal in step 3, the process proceeds to step S4 wherein the voltage measurement/determination process of the analog leadless terminal is executed with respect to the integrated circuit 10 by means of the function of the failure diagnosis control unit 46 which is realized by executing the failure diagnosis program, and the failure diagnosis program is unloaded in step S5. On the other hand, when the diagnosis result of the serial bus 30 is determined to be abnormal in step S3, the diagnosis result is saved in step S6, and the failure diagnosis program is unloaded in step S5.

Figure 8:
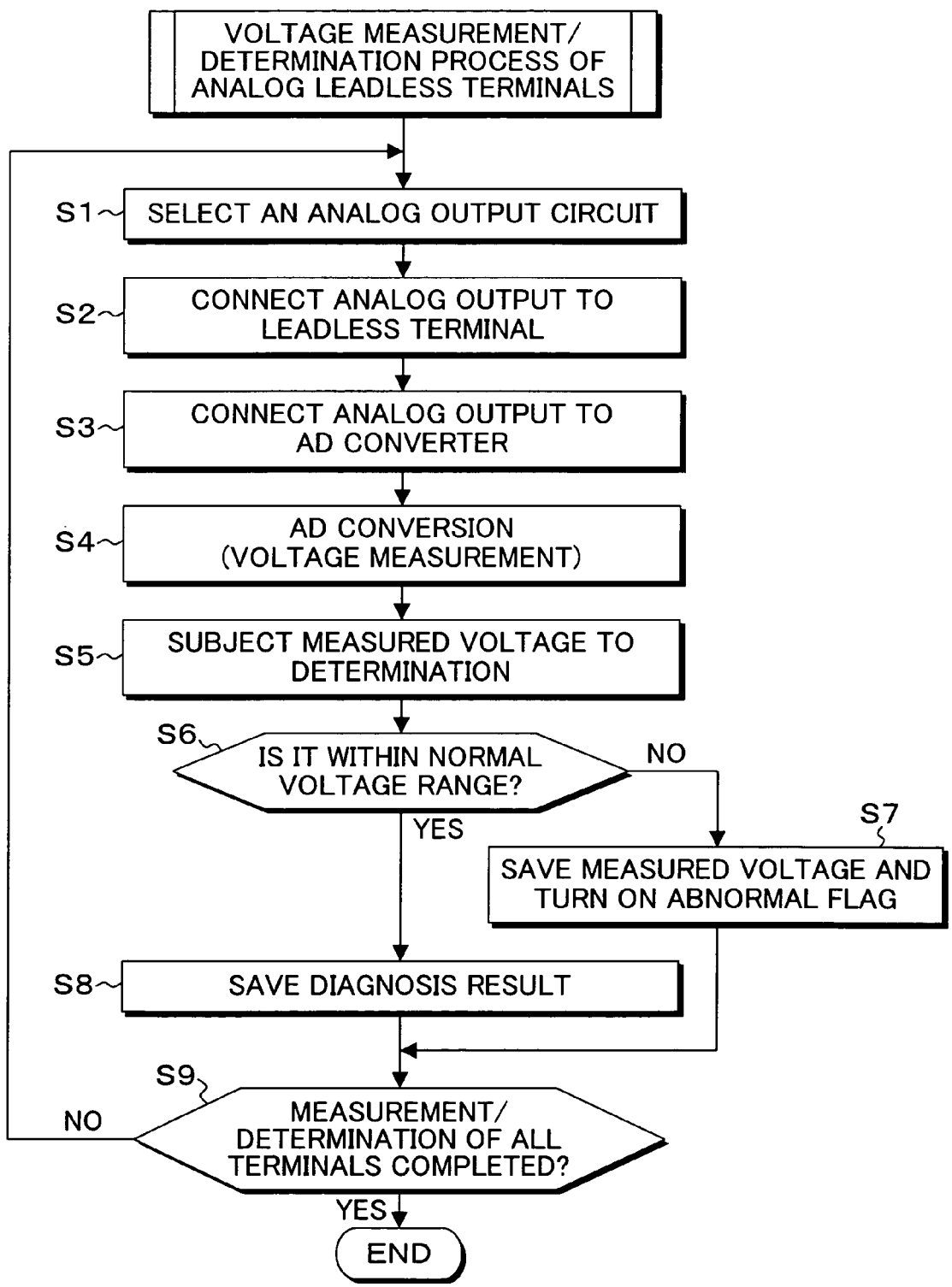
FIG. 8 is a flow chart of the voltage measurement/determination process of the analog leadless terminals of FIG. 7.

FIG. 8 is a flow chart of the voltage measurement/determination process of the analog leadless terminal in step S4 of FIG. 7. In FIG. 8, one circuit is selected from the plurality of analog output circuits in step S1, and the analog output is connected to the leadless terminal by turning on the first selector switch in the switching unit 78 in step S2. Subsequently, the analog output of the leadless terminal is connected to the AD converter 86 by turning on the second selector switch of the switching unit 78 in step S3. Subsequently, AD conversion of the AD converter 86 is performed, thereby measuring and transferring the analog output voltage of the leadless terminal in step S4. Next, in step S5, the determination unit 90 subjects the measured voltage to determination by, for example, comparing it with the normal voltage range 106 and the abnormal voltage ranges 108 and 110 which are set in advance as the determination criteria as shown in FIG. 6. According to the determination, whether it is in the normal voltage range or not is checked in step S6; and, if it is in any of the abnormal voltage ranges, the process proceeds to step S7 wherein the measured voltage is saved in the failure diagnosis file and the abnormal flag is turned on. If it is in the normal voltage range, the diagnosis result is saved in step S8. Subsequently, whether measurement/determination of all terminals has completed or not is checked in step S9; and if uncompleted, the process from step S1 is repeated. When completion of the measurement/determination of all terminals is determined in step S9, the process ends.

Figure 9:
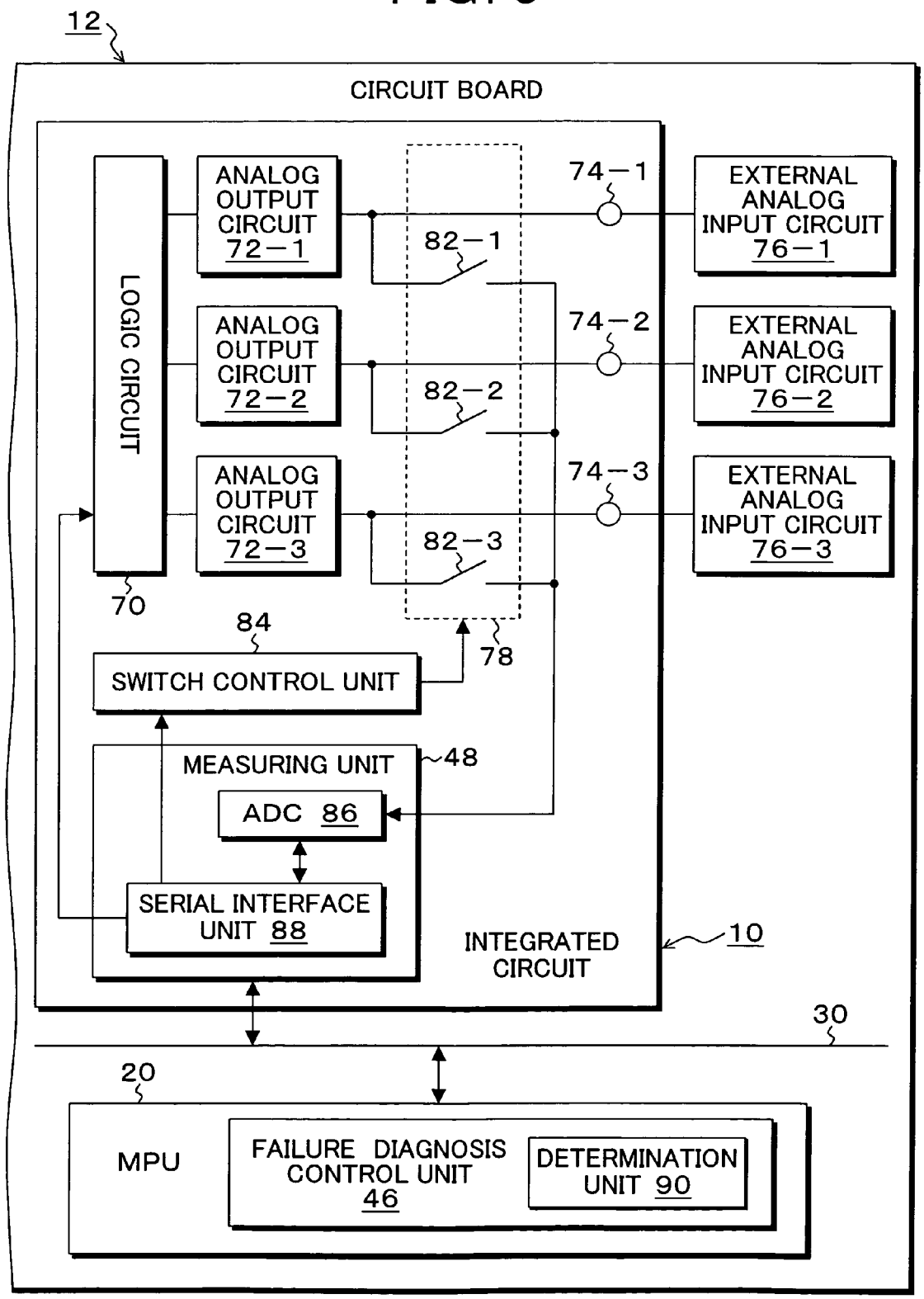
FIG. 9 is a block diagram of another embodiment of the present invention for self-diagnosing failure of signal lines including leadless terminals for analog output.

FIG. 9 is a block diagram of another embodiment of the integrated circuit according to the present invention for self-diagnosing failure of signal lines including the leadless terminals for analog output. This embodiment is characterized in that the switching unit 78 comprises merely the second selector switches 82-1 to 82-3 wherein the first selector switches 80-1 to 80-3 in FIG. 3 are removed so as to simplify the circuit configuration, and the circuit configuration and functions other than this are same as that of the embodiment of FIG. 3. When the second selector switches 82-1 to 82-3 for selectively connecting the analog output lines which passes through the leadless terminals 74-1 to 74-3 to the AD converter 86 of the measuring unit 48 are provided in the switching unit 78 in the above described manner, and these are sequentially switched and connected according to signals from the switch control unit 84 upon failure diagnosis, the analog output voltages of the leadless terminals 74-1 to 74-3 can be measured and transferred through the serial bus 30, thereby determining whether they are in the normal voltage range or any of the abnormal voltage ranges by the determination unit 90. It should be noted that, in the embodiment of FIG. 9, upon failure diagnosis, measurement is performed while a particular leadless terminal is connected to the AD converter 86 by the switching unit 78 in a state in which respective analog output voltages are applied to all of the leadless terminals 74-1 to 74-3; and, if a foreign conductive substance has adhered to any of the leadless terminals 74-1 to 74-3, abnormality caused by the foreign conductive substance which is adhering between it and a plus line or a ground line of the circuit board side can be accurately detected.

Figure 10:
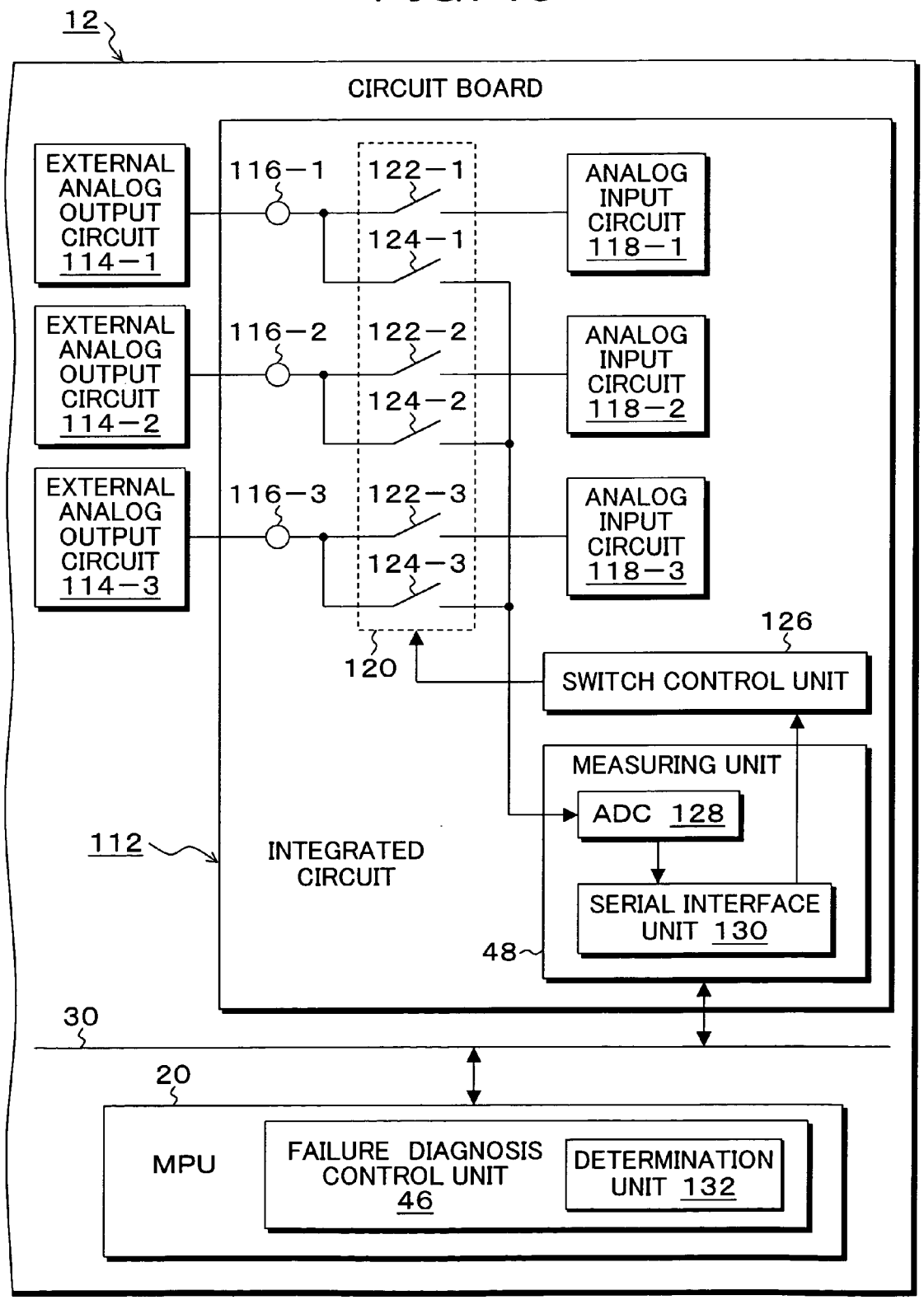
FIG. 10 is a block diagram of an embodiment of the present invention for self-diagnosing failure of signal lines including leadless terminals for analog input.

FIG. 10 is a block diagram showing an embodiment of an integrated circuit according to the present invention for self-diagnosing failure of signal lines including leadless terminals for analog input. In FIG. 10, external analog output circuits 114-1 to 114-3 are provided on the circuit board 12 on which an integrated circuit 112 is mounted, and, to the circuit pattern of the output lines thereof connected by soldering are leadless terminals 116-1 to 116-3 which are provided on the integrated circuit 112. The leadless terminals 116-1 to 116-3 of the integrated circuit 112 are connected to analog input circuits 118-1 to 118-3. The measuring unit 48 of the integrated circuit 112 comprises a switching unit 120, a switch control unit 126, an AD-converter 128, and a serial interface unit 130. In the switching unit 120 provided are first selector switches 122-1 to 122-3 which are provided on input lines of the leadless terminals 116-1 to 116-3 and the analog input circuits 118-1 to 118-3 and second selector switches 124-1 to 124-3 for selectively connecting the input lines in the leadless terminal 116-1 to 116-3 side to the AD converter 128. When a failure diagnosis command issued from the failure diagnosis control unit 46 of the MPU 20 is received by the serial interface unit 130, the first selector switches 122-1 to 122-3 and the second selector switches 124-1 to 124-3 of the switching unit 120 obtain a failure diagnosis state by sequentially turning on pairs of the first selector switches and the second selector switches along the order of the leadless terminals 116-1 to 116-3 according to control signals from the switch control unit 126. More specifically, during failure diagnosis of the leadless terminal 116-1, the first selector switch 122-1 and the second selector switch 124-1 are turned on, and others, i.e., the first selector switches 122-2 to 122-3 and the second selector switches 124-2 to 124-3 are turned off.

Figure 11:
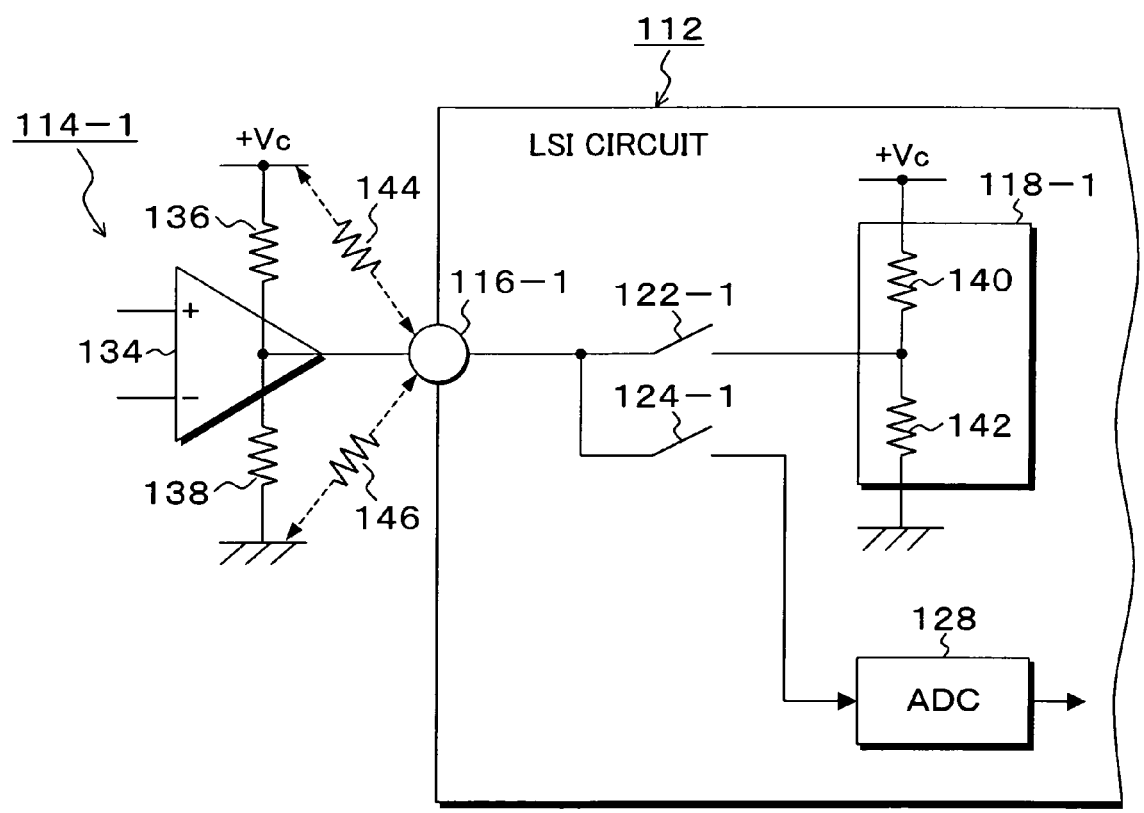
FIG. 11 is a explanatory drawing of the diagnosis fundamentals with respect to a leadless terminal for analog input in FIG. 10.

FIG. 11 is an explanatory drawing showing the failure diagnosis fundamentals, wherein the leadless terminal 116-1 for analog input in FIG. 10 is taken as an example. In FIG. 11, the external analog output circuit 114-1 can be represented by an operational amplifier 134 and output resistance 136 and 138 connected in series between a power supply line and ground. The output line of the external analog output circuit 114-1 is connected to the leadless terminal 116-1 of the integrated circuit 112 by soldering. The leadless terminal 116-1 is input and connected to the analog input circuit 118-1 via the first selector switch 122-1. The input unit of the analog input circuit 118-1 can be represented by a circuit in which input resistance 140 and 142 are connected in series between a power supply line and ground. The line of the leadless terminal 116-1 is also input and connected to the AD converter 128 via the second selector switch 124-1. Foreign conductive substances may adhere to the leadless terminal 116-1 for analog input of the integrated circuit 112 during soldering. The foreign conductive substances include a foreign conductive substance 144 which adheres between the leadless terminal 116-1 and a plus pattern of the outside circuit board and a foreign conductive substance 146 which adheres between the leadless terminal 116-1 and a ground line of the outside circuit board; and the foreign conductive substances 144 and 146 can be considered as resistance components that have certain values.

Figure 12A:
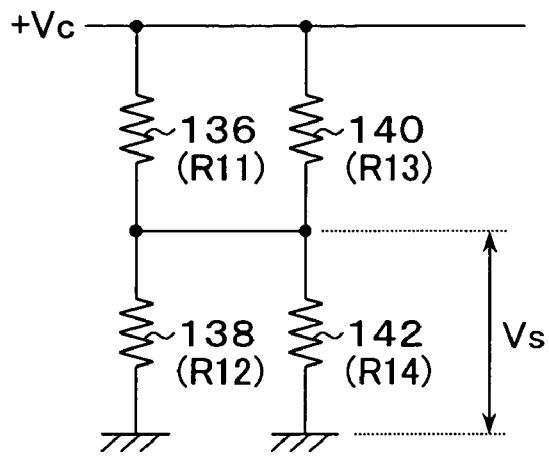
FIGS. 12A to 12C are equivalent circuit diagrams of the input/output impedance of the cases when the leadless terminal of FIG. 11 is normal and when a foreign conductive substance adheres.
Figure 12B:
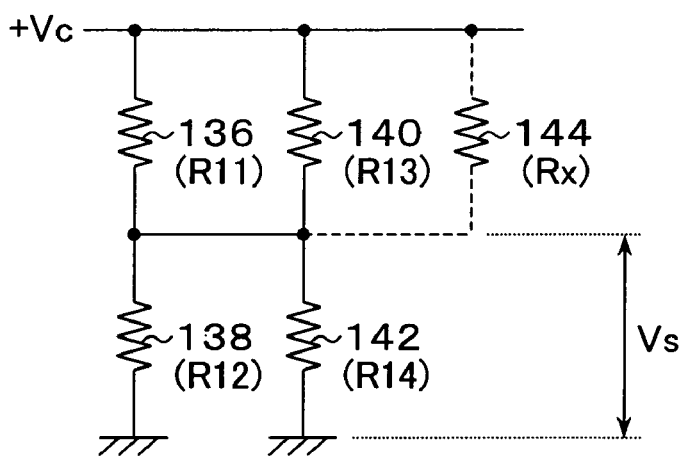
Figure 12C:
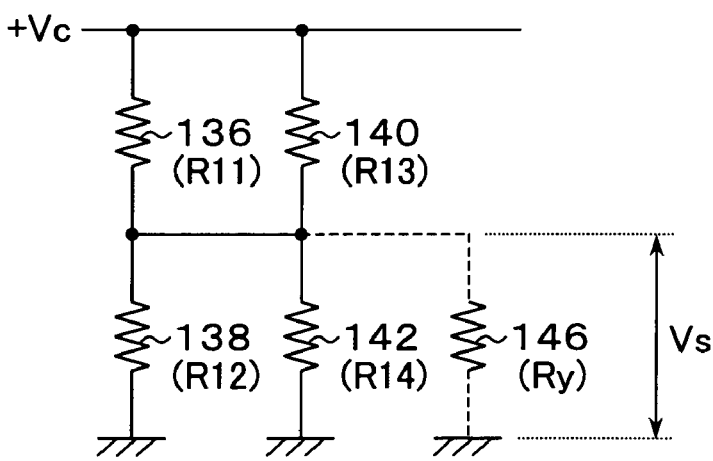

FIGS. 12A to 12C show equivalent circuit diagrams of the input/output impedance of the cases when the leadless terminal of FIG. 11 is normal and when a foreign conductive substance has adhered. FIG. 12A is the equivalent circuit diagram of the normal case when no foreign conductive substance is adhering to the leadless terminal, wherein it comprises a ladder type circuit in which circuits including the input resistance 140 and 142 of the integrated circuit side which are connected in series to the series circuit of the output resistance 136 and 138 are connected by voltage dividing points. When the resistance value of the output resistance 136 is R11, the resistance value of the output resistance 138 is R12, the resistance value of the input resistance 140 is R13, and the resistance value of the input resistance 142 is R14, the analog input voltage Vs of the leadless terminal of this case can be obtained by the following expression.

$$V_S = \frac{(R12 // R14)}{(R11 // R13) + (R12 // R14)} V_C \qquad \text{Expression 4}$$

Herein, if R11=R12 and R13=R14, the analog input voltage Vs of a normal case is: Vs=Vc/2. In addition, specific examples of the resistance values of the output resistance 136 and 138 are, for example, R11=R12=300 KΩ; and the resistance values of the input resistance 140 and 142 are, for example, R13=R14=1 MΩ. Therefore, parallel resistance values of this case are:

(R11//R13)=(R12//R14)=230 KΩ.

FIG. 12B shows a case in which the foreign conductive substance 144 has adhered to the leadless terminal 116-1 of FIG. 11, wherein a resistance component Rx is added. The analog input voltage Vs of the leadless terminal in this case can be obtained by the following expression.

$$V_S = \frac{(R12 // R14)}{(R11 // R13 // Rx) + (R12 // R14)} V_C \qquad \text{Expression 5}$$

When the resistance component Rx caused by the foreign conductive substance 144 is added, the analog input voltage Vs of the leadless terminal changes to a voltage that is higher than that in the normal case of FIG. 12A.

FIG. 12C shows a case in which the foreign conductive substance 146 has adhered in FIG. 11, wherein a resistance component Ry is added. The analog input voltage Vs of the leadless terminal in the case in which the foreign conductive substance 146 has adhered can be obtained by the following expression.

$$V_S = \frac{(R12 // R14 // Ry)}{(R11 // R13) + (R12 // R14 // Ry)} V_C \qquad \text{Expression 6}$$

Thus, in this case, since the resistance component Ry caused by the foreign conductive substance is added, the analog input voltage Vs of the leadless terminal changes to a voltage that is lower than that in the normal case of FIG. 12A.

Figure 13:
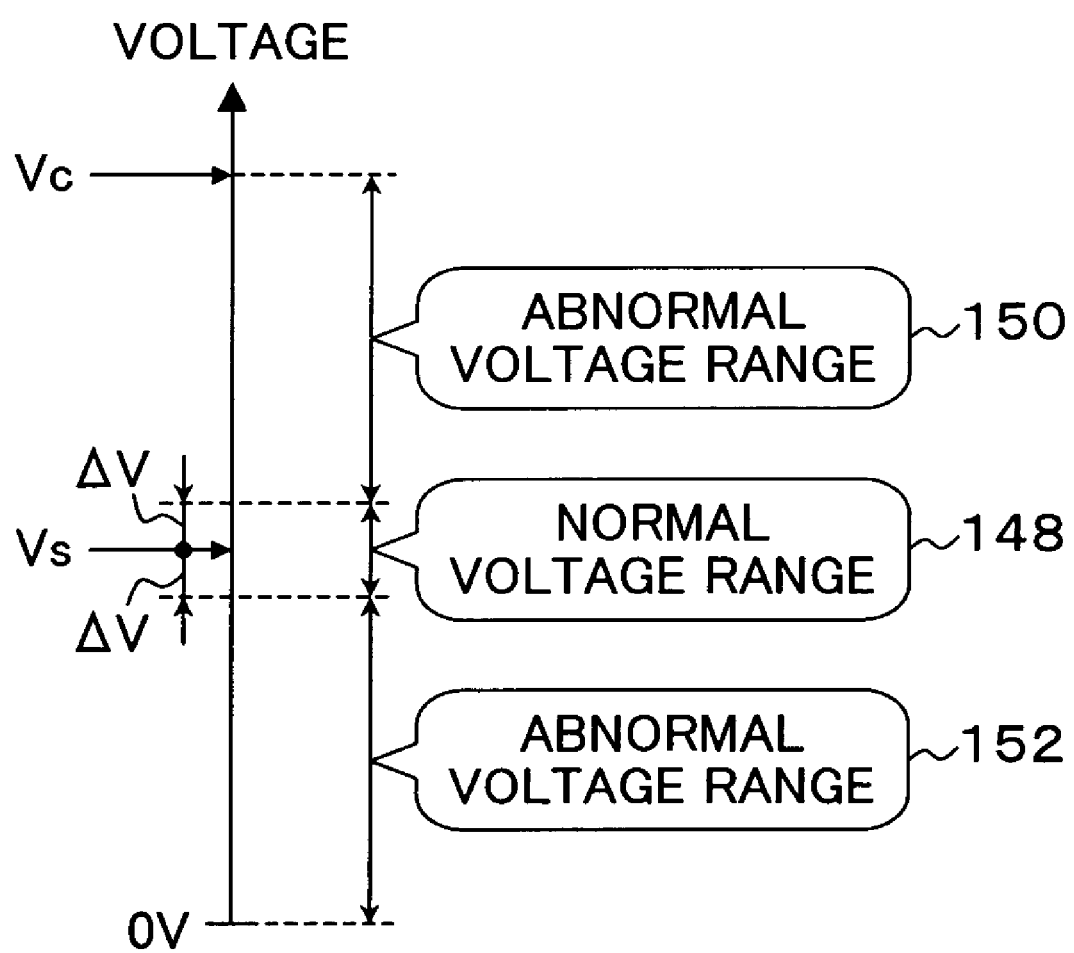
FIG. 13 is explanatory drawing of a normal voltage range and abnormal voltage ranges of the analog input voltage subjected to determination by the determination unit of FIG. 10.

FIG. 13 is an explanatory drawing of the normal voltage range and abnormal voltage ranges of the analog input voltage which is subjected to determination by a determination unit 132 which is provided in the MPU 20 side of FIG. 10. In FIG. 13, the analog input voltage Vs in the normal case of FIG. 12A is, for example, Vs=Vc/2; and, centered on this, a ±ΔV permissible range of the analog input voltage is set, and this is determined as a normal voltage range 148. With respect to the normal voltage range 148, an abnormal voltage range 150 exceeding it and an abnormal voltage range 152 below it are set. Such normal voltage range 148 and abnormal voltage ranges 150 and 152 of FIG. 13 are set in advance in the determination unit 132 of FIG. 10; each of the analog input voltages of the leadless terminals 116-1 to 116-3 which have been measured by the AD converter 128 are subjected to comparison/determination in a failure diagnosis process; and if it is abnormal, the measured voltage is saved in a failure diagnosis file and an abnormal flag is turned on. Herein, the normal voltage range and the abnormal voltage ranges shown in FIG. 13 are provided on the supposition that all input/output impedance viewed from the leadless terminals 116-1 to 116-3 in FIG. 10 is same; however, when the input/output impedance of each leadless terminal is different, the normal voltage range and the abnormal voltage ranges corresponding to the respective impedance will be set. A control process of the failure diagnosis control unit 46 provided in the MPU 20 of FIG. 10 is as shown in the flow chart of FIGS. 14A and 14B.

Figure 14A:
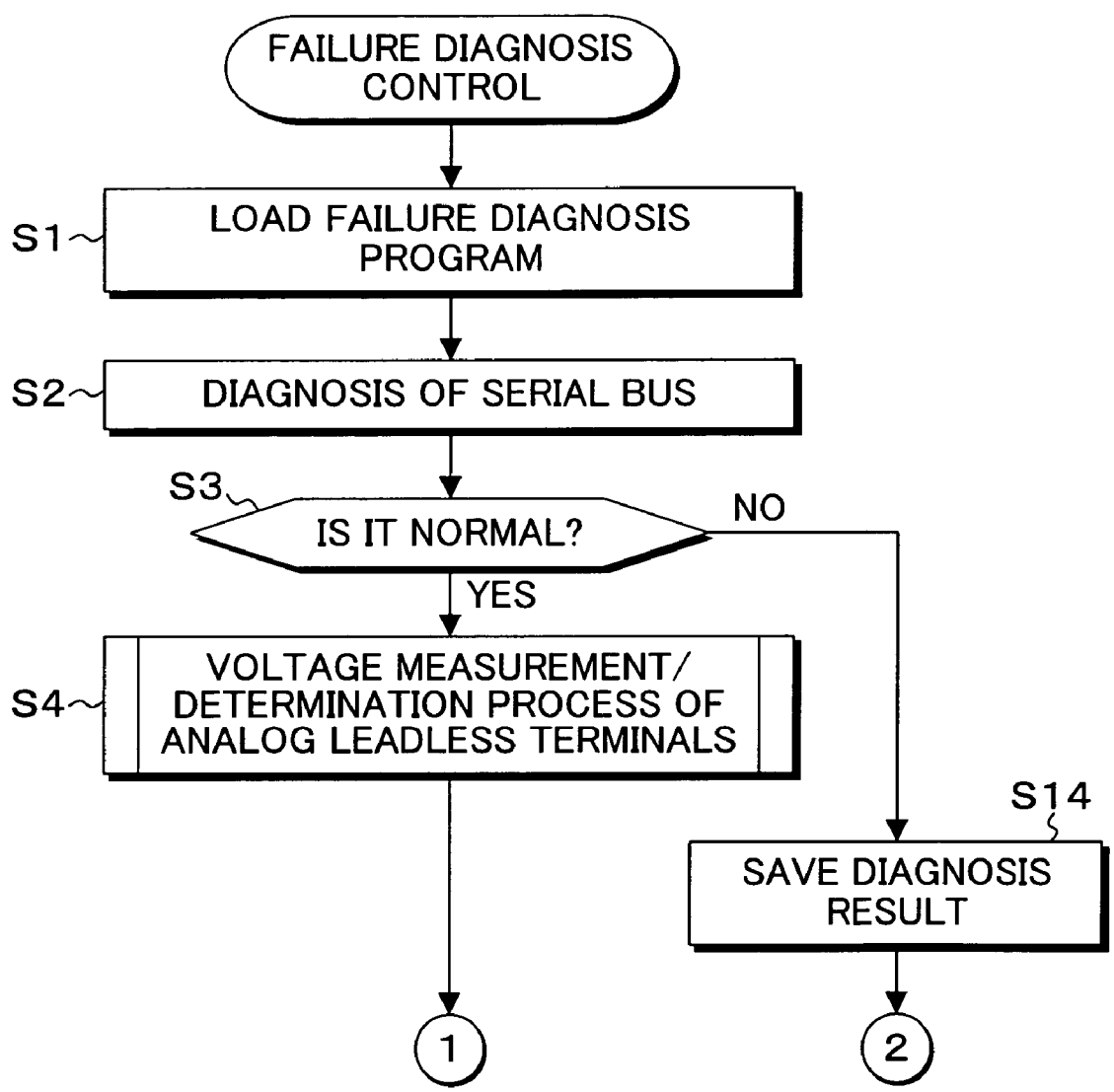
FIGS. 14A and 14B are flow charts of the voltage measurement/determination process of analog leadless terminals of FIG. 10.
Figure 14B:
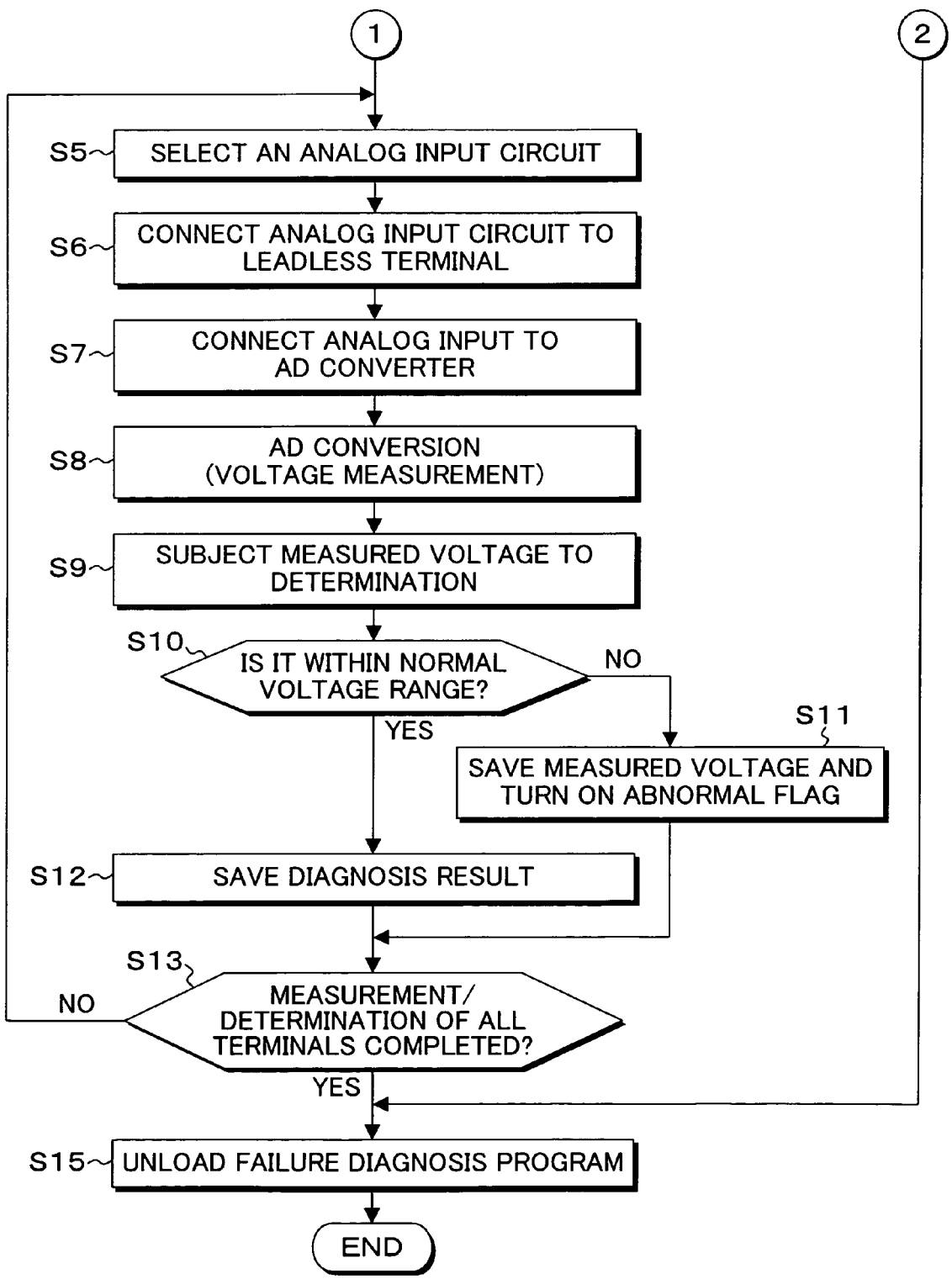

In FIGS. 14A and 14B, first, the failure diagnosis program is loaded from the outside test equipment in step S1, and diagnosis of the serial bus 30, which performs serial transfer between the MPU 20 and the measuring unit 48 of the integrated circuit 10, is executed in step S2. In this diagnosis, for example, whether the same data can be read from the MPU 20 after the data is transferred and written to an arbitrary register used in the measuring unit 48 side is diagnosed, by causing it to perform read response. When the diagnosis result of the serial bus 30 is determined to be normal in step 3, the process proceeds to step S4 wherein the voltage measurement/determination process S4 of the analog leadless terminal is executed with respect to the integrated circuit 112 by means of the function of the failure diagnosis control unit 46 which is realized by executing the failure diagnosis program. On the other hand, when the diagnosis result of the serial bus 30 is determined to be abnormal in step S3, the diagnosis result is saved in step S14, and the failure diagnosis program is unloaded so as to end the process in step S15. The details of the voltage measurement/determination process of the analog leadless terminals in step S4 are the processes of step S5 to S15. More specifically, one circuit is selected from the plurality of analog input circuits in step S5, and the input of the analog input circuit is connected to the leadless terminal by turning on the first selector switch in the switching unit 120 in step S6. Subsequently, the leadless terminal is connected to the AD converter 128 by turning on the second selector switch of the switching unit 120 in step S7. Subsequently, AD conversion of the AD converter 128 is performed, thereby measuring and transferring the analog input voltage of the leadless terminal in step S8. Next, in step S9, the determination unit 132 subjects the measured voltage to determination by, for example, comparing it with the normal voltage range 148 and the abnormal voltage ranges 150 and 152 which are set in advance as the determination criteria as shown in FIG. 13. According to the determination, whether it is in the normal voltage range or not is checked in step S10; and, if it is in any of the abnormal voltage ranges, the process proceeds to step S11 wherein the measured voltage is saved in the failure diagnosis file and the abnormal flag is turned on. If it is in the normal voltage range, the diagnosis result is saved in step S12. Subsequently, whether all voltage measurement/determination has completed or not is checked in step S13; and if uncompleted, the process from step S5 is repeated. When completion of the measurement/determination of all terminals is determined in step S13, the failure diagnosis program is unloaded in step S15 so as to end the series of processes.

Figure 15:
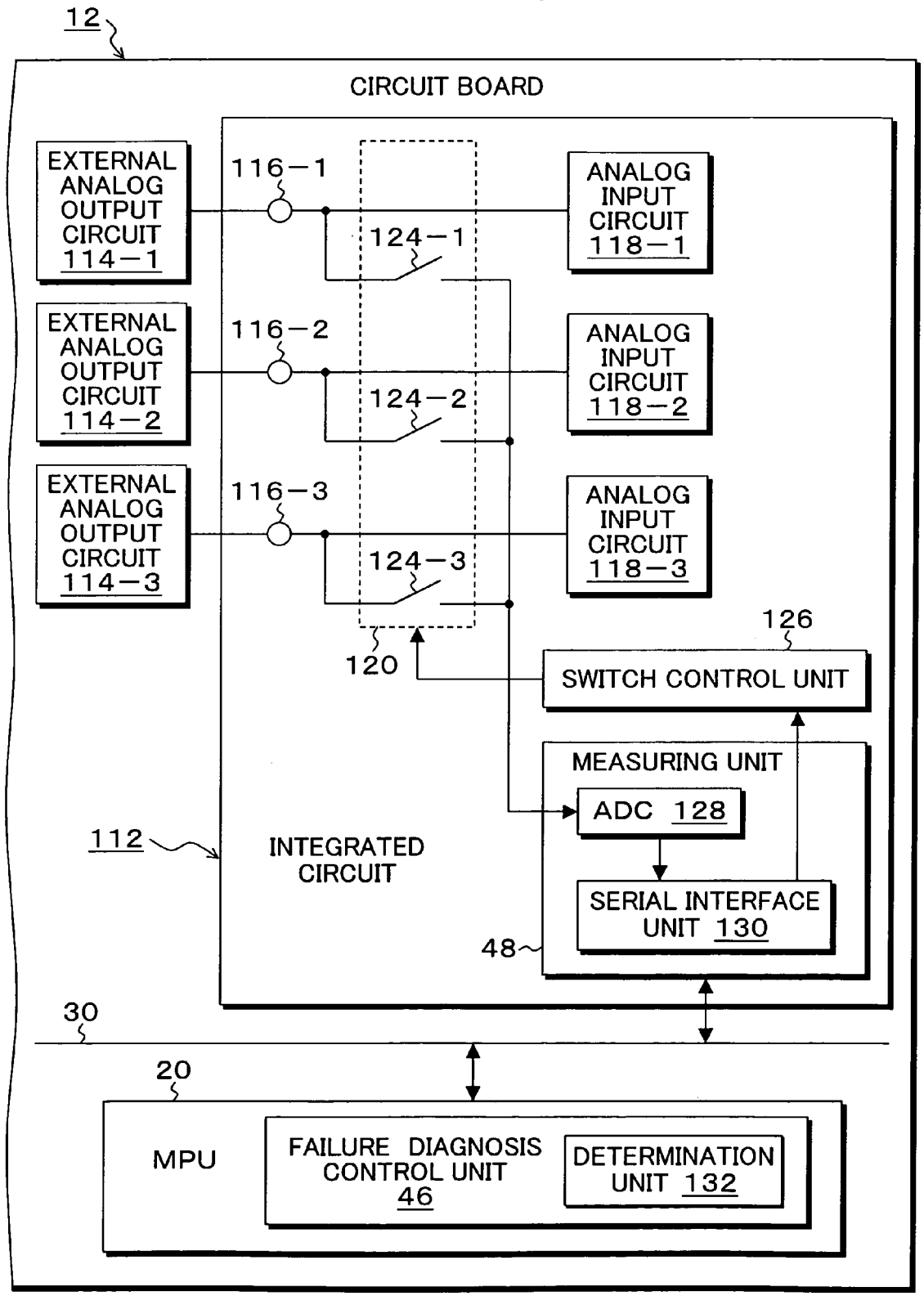
FIG. 15 is a block diagram of another embodiment of the present invention for self-diagnosing failure of signal lines including leadless terminals for analog input.

FIG. 15 is a block diagram of another embodiment of the integrated circuit according to the present invention for self-diagnosing failure of signal lines including leadless terminals for analog input; and, this embodiment is characterized in that the circuit configuration is simplified by, in the switching unit 120, removing the first selector switches 122-1 to 122-3 provided in the embodiment of FIG. 10 and merely providing the second selector switches 124-1 to 124-3. The configuration and functions other than this are same as the embodiment of FIG. 10. The devices using the circuit board on which the integrated circuit of the present invention is mounted include, for example, arbitrary information processing devices and instruments such as magnetic disk devices. Although the cases in which the MPU (processor) is mounted on the circuit board on which the integrated circuit of the present invention is mounted are shown as examples in the above described embodiments, the MPU may be incorporated in the integrated circuit. Although the determination unit is provided in the MPU in the above described embodiments, it may be provided in the outside test equipment. The present invention includes arbitrary modifications that do not impair the objects and advantages thereof, and is not limited by the numerical values shown in the above described embodiments.

What is claimed is:

1. An integrated circuit, comprising:
an analog output circuit for outputting an analog signal;
a leadless terminal, which is positioned on the back of a package, and upon mounting onto a circuit board, is hidden from outside, for connecting an output line of the analog output circuit to said circuit board by soldering; and
a measuring unit for measuring an analog output voltage of the leadless terminal in a state of soldering connection to said circuit board,
wherein said measuring unit comprises:
a switching unit for obtaining a failure diagnosis state upon failure diagnosis by connecting the output line of the analog output circuit to the measuring unit; and
an AD converter for measuring the analog output voltage of the leadless terminal in the failure diagnosis state obtained by the switching unit,
wherein said measuring unit transfers the measured analog output voltage of the leadless terminal from the AD converter to an outside determination unit; and
said switching unit comprises a first switching unit for connecting the output line of the analog output circuit which is a target of diagnosis to the AD converter upon failure diagnosis, and a second switching unit for connecting the output line of the analog output circuit which is the target of diagnosis of the leadless terminal.

2. The integrated circuit according to claim 1, wherein when a plurality of the analog output circuits are present, the switching unit sequentially connects the output lines of the analog output circuits which are targets of diagnosis to the AD converter upon failure diagnosis.

3. The integrated circuit according to claim 1, wherein the measuring unit receives an instruction from a processor which is incorporated in the integrated circuit or mounted on the circuit board so as to execute measurement of the analog output voltage of the leadless terminal and return the measurement result.

4. An integrated circuit, comprising:
an analog input circuit for inputting an analog signal from outside;
a leadless terminal, which is positioned on the back of a package, and upon mounting onto a circuit board, is hidden from outside, for connecting an input line of the analog input circuit to an output line of an external analog output circuit provided on said circuit board by soldering; and
a measuring unit for measuring an analog input voltage of the leadless terminal in a state of soldering connection to said circuit board,
wherein said measuring unit comprises:
a switching unit for obtaining a failure diagnosis state upon failure diagnosis by connecting the output line of the analog output circuit to the measuring unit; and
an AD converter for measuring the analog output voltage of the leadless terminal in the failure diagnosis state obtained by the switching unit,
wherein said measuring unit transfers the measured analog output voltage of the leadless terminal from the AD converter to an outside determination unit, and
said switching unit comprises a first switching unit for connecting the output line of the analog output circuit which is a target of diagnosis to the AD converter upon failure diagnosis, and a second switching unit for connecting the output line of the analog output circuit which is the target of diagnosis of the leadless terminal.

5. The integrated circuit according to claim 4, wherein when a plurality of the analog input circuits are present, the switching unit sequentially connects the input lines of the analog input circuits which are targets of diagnosis to the AD converter upon failure diagnosis.

6. The integrated circuit according to claim 4, wherein the switching unit comprises a first switching unit for connecting the input line of the analog input circuit which is a target of diagnosis to the AD converter upon failure diagnosis, and a second switching unit for connecting the input line of the analog input circuit which is the target of diagnosis to the leadless terminal.

7. The integrated circuit according to claim 4, wherein the measuring unit receives an instruction from a processor which is incorporated in the integrated circuit or mounted on the circuit board so as to execute measurement of the analog input voltage of the leadless terminal and transfer the measurement result.

8. A circuit board on which an integrated circuit and an external circuit thereof are mounted, the integrated circuit comprising:
an analog output circuit for outputting an analog signal;
a leadless terminal, which is positioned on the back of a package, and upon mounting onto the circuit board, is hidden from outside, for connecting an output line of the analog output circuit to the circuit board by soldering; and
a measuring unit for measuring an analog output voltage of the leadless terminal in a state of soldering connection to said circuit board,
wherein said measuring unit comprises:
a switching unit for obtaining a failure diagnosis state upon failure diagnosis by connecting the output line of the analog output circuit to the measuring unit; and
an AD converter for measuring the analog output voltage of the leadless terminal in the failure diagnosis state obtained by the switching unit,
wherein said measuring unit transfers the measured analog output voltage of the leadless terminal from the AD converter to an outside determination unit, and
said switching unit comprises a first switching unit for connecting the output line of the analog output circuit which is a target of diagnosis to the AD converter upon failure diagnosis, and a second switching unit for connecting the output line of the analog output circuit which is the target of diagnosis of the leadless terminal.

9. The circuit board according to claim 8, wherein when a plurality of the analog output circuits are present, the switching unit sequentially connects the output lines of the analog output circuits which are targets of diagnosis to the AD converter upon failure diagnosis.

10. The circuit board according to claim 8, wherein the measuring unit receives an instruction from a processor which is incorporated in the integrated circuit or mounted on the circuit board so as to execute measurement of the analog output voltage of the leadless terminal and transfer the measurement result.

11. A circuit board on which an integrated circuit and an external circuit thereof are mounted, the integrated circuit comprising:
an analog input circuit for inputting an analog signal from outside;
a leadless terminal, which is positioned on the back of a package, and upon mounting onto the circuit board, is hidden from outside, for connecting an input line of the analog input circuit to an output line of the external analog output circuit provided on the circuit board by soldering; and
a measuring unit for measuring an analog input voltage of the leadless terminal in a state of soldering connection to said circuit board,
wherein said measuring unit comprises:
a switching unit for obtaining a failure diagnosis state upon failure diagnosis by connecting the output line of the analog output circuit to the measuring unit; and
an AD converter for measuring the analog output voltage of the leadless terminal in the failure diagnosis state obtained by the switching unit,
wherein said measuring unit transfers the measured analog output voltage of the leadless terminal from the AD converter to an outside determination, and
said switching unit comprises a first switching unit for connecting the output line of the analog output circuit which is a target of diagnosis to the AD converter upon failure diagnosis, and a second switching unit for connecting the output line of the analog output circuit which is the target of diagnosis of the leadless terminal.

12. The circuit board according claim 11, wherein when a plurality of the analog input circuits are present, the switching unit sequentially connects the input lines of the analog input circuits which are targets of diagnosis to the AD converter upon failure diagnosis.

13. The circuit board according to claim 11, wherein the measuring unit receives an instruction from a processor which is incorporated in the integrated circuit or mounted on the circuit board so as to execute measurement of the analog input voltage of the leadless terminal and transfer the measurement result.

14. An integrated circuit package connecting structure, comprising:

an integrated circuit package incorporating an integrated circuit and a circuit board;

wherein a leadless terminal is provided on the surface of each of the back of said package and a circuit board opposite to said back, respectively, and the two leadless terminals are connected by soldering; and wherein said integrated circuit package comprises, incorporated therein:

a plurality of analog output circuits outputting analog signals from the logic circuit;

said leadless terminal connected to these analog output circuits;

a measuring unit;

switching units which selectively connect the individual output lines of the analog output circuit to said measuring unit;

and further wherein, upon failure diagnosis, in a state connected to the corresponding analog input circuit via said switching unit, an analog output voltage of the analog output circuit leading to a failure diagnosis state is measured by sequentially sending analog output voltage sent from the individual output lines of said analog output circuit to said measuring unit.

* * * * *